(12) United States Patent
Bakker et al.

(10) Patent No.: US 6,911,864 B2
(45) Date of Patent: Jun. 28, 2005

(54) CIRCUIT, INCLUDING FEEDBACK, FOR REDUCING DC-OFFSET AND NOISE PRODUCED BY AN AMPLIFIER

(75) Inventors: Anthonius Bakker, Delft (NL); Johan H. Huijsing, Schipluiden (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 407 days.

(21) Appl. No.: 09/826,571

(22) Filed: Apr. 5, 2001

(65) Prior Publication Data

US 2001/0011923 A1 Aug. 9, 2001

Related U.S. Application Data

(63) Continuation of application No. 09/439,240, filed on Nov. 12, 1999, now Pat. No. 6,262,626.

(30) Foreign Application Priority Data

Nov. 12, 1998 (EP) .............................................. 98203827

(51) Int. Cl.[7] .................................................. H03F 1/02
(52) U.S. Cl. ............................... 330/9; 330/69; 327/124
(58) Field of Search ............................... 330/9, 51, 69; 327/124, 307

(56) References Cited

U.S. PATENT DOCUMENTS

| | | | | |
|---|---|---|---|---|
| 4,048,574 A | * | 9/1977 | Barbier et al. ................. 330/9 |
| 4,210,872 A | * | 7/1980 | Gregorian ....................... 330/9 |
| 4,430,622 A | * | 2/1984 | Simoes ........................... 330/9 |
| 4,714,843 A | * | 12/1987 | Smith ........................... 307/491 |
| 4,939,516 A | * | 7/1990 | Early ........................... 341/143 |
| 5,206,602 A | * | 4/1993 | Baumgartner et al. .......... 330/9 |
| 5,585,756 A | * | 12/1996 | Wang ........................... 327/341 |
| 5,600,275 A | * | 2/1997 | Garavan ....................... 327/307 |
| 5,663,680 A | * | 9/1997 | Nordeng ........................ 330/9 |
| 5,736,895 A | * | 4/1998 | Yu et al. ....................... 327/554 |
| 5,751,154 A | * | 5/1998 | Tsugai .......................... 324/661 |
| 5,793,243 A | * | 8/1998 | Farrow ......................... 327/345 |
| 6,313,685 B1 | * | 11/2001 | Rabii ........................... 327/307 |
| 6,509,777 B2 | * | 1/2003 | Razavi et al. ................ 327/307 |

* cited by examiner

Primary Examiner—Henry Choe
(74) Attorney, Agent, or Firm—Aaron Waxler

(57) ABSTRACT

An amplifier (AMP) is provided with a pair of choppers ($CHP_i$,$CHP_o$) in order to reduce the DC-offset and the noise produced by the amplifier (AMP). To obtain an optimal noise reduction the pair of choppers ($CHP_i$,$CHP_o$) operate on a high frequency. As a result the DC-offset cancellation is not optimal because a so-called charge injection of the switches in the pair of choppers ($CHP_i$,$CHP_o$) produces a DC-offset. To overcome this problem the amplifier (AMP) is further provided with further offset cancellation means which are for example formed by a further pair of choppers ($CHP_{fi}$,$CHP_{fo}$). This further pair of choppers ($CHP_{fi}$,$CHP_{fo}$) operates on a relatively low frequency. The combination of the pair of choppers ($CHP_i$,$CHP_o$) and the further pair of choppers ($CHP_{fi}$,$CHP_{fo}$) guarantees an optimal DC-offset cancellation as well as an optimal noise cancellation.

14 Claims, 2 Drawing Sheets

CIRCUIT, INCLUDING FEEDBACK, FOR REDUCING DC-OFFSET AND NOISE PRODUCED BY AN AMPLIFIER

RELATED APPLICATION

This is a continuation of U.S. patent application Ser. No. 09/439,240, filed on Nov. 12, 1999 now U.S. Pat. No. 6,262,626, and entitled "Circuit Comprising Means For Reducing DC-Offset And Noise Produced By An Amplifier".

FIELD OF THE INVENTION

The present invention is directed to amplifier circuits and, more specifically, to amplifier circuits susceptible to problems involving DC offsets and noise.

BACKGROUND OF THE INVENTION

Such a circuit is known from the general state of the art as shown in FIG. 1. The known circuit comprises an amplifier AMP having a differential input 5;6 comprising an input node 5 and an input node 6, and a differential output 7;8 comprising an output node 7 and an output node 8. The circuit further comprises an input chopper $CHP_i$ arranged in cascade in between a differential input 1;2 of the circuit and the differential input 5;6 of the amplifier AMP, and an output chopper $CHP_o$ synchronised with the input chopper $CHP_i$, which output chopper $CHP_o$ is arranged in cascade in between the differential output 7;8 of the amplifier AMP and a differential output 3;4 of the circuit. The operation of the known circuit is as follows. An input signal $V_{in}$ is supplied to the differential input 1;2. In response to the input signal $V_{in}$ an output signal $V_{out}$ is delivered to the differential output 3;4. The input chopper $CHP_i$ is arranged for alternately coupling either input terminals 1 and 2 of the differential input 1;2 to respectively input nodes 5 and 6 of the differential input 5;6 during a first phase $PHi_1$, or input terminals 1 and 2 of the differential input 1;2 to respectively input nodes 6 and 5 of the differential input 5;6 during a second phase $PHI_2$. The output chopper $CHP_o$ is arranged for alternately coupling either output nodes 7 and 8 of the differential output 7;8 to respectively output terminals 3 and 4 of the differential output 3;4 during a first phase $PHi_1$, or output nodes 7 and 8 of the differential output 7;8 to respectively output terminals 4 and 3 of the differential output 3;4 during a second phase $PHI_2$. The input signal $V_{in}$ is converted to the output signal $V_{out}$ in virtually the same manner as in the case that the input chopper $CHP_i$ and the output chopper $CHP_o$ would not have been present. However by the presence of the input chopper $CHP_i$ and the output chopper $CHP_o$ the offset produced by the amplifier AMP, which offset is denoted as $V_{os}$ in FIG. 1, is eliminated. Also the noise produced by the amplifier AMP is significantly reduced for frequencies lower than the switching frequency of the switches in the input chopper $CHP_i$ and the output chopper $CHP_o$. For the purpose of reducing the noise produced by the amplifier AMP the aforementioned switching frequency must be as high as possible.

A problem of the known circuit is that for a high switching frequency the so-called charge injection caused by the switches of the input chopper $CHP_i$ and the output chopper $CHP_o$ causes a DC-offset in the output signal $V_{out}$. Thus with the known circuit an optimal DC-offset reduction can only be accomplished if the switching frequency is low. In that case the noise reduction is not optimal. On the other hand an optimal noise reduction is accomplished if the switching frequency is high. In that case however the DC-offset reduction is not optimal. Thus, with the known circuit, an optimal DC-offset reduction and an optimal noise reduction can not be accomplished at the same time.

SUMMARY OF THE INVENTION

The present invention is directed to overcoming the above-mentioned challenges and others related to amplifier offset and noise. The present invention is exemplified in a number of implementations and applications, some of which are summarized below.

One aspect of the present invention is directed to a circuit including an amplifier producing a DC-offset and noise having an input for receiving an input signal from an input of the circuit, and an output for delivering an output signal to an output of the circuit; means for reducing the DC-offset and the noise produced by the amplifier; and feedback means for further reducing the DC-offset produced by the amplifier.

In a more particular example embodiment of the present invention, the means for reducing the DC-offset and the noise produced by the amplifier comprises an input chopper arranged in cascade in between the input of the circuit and the input of the amplifier, and an output chopper synchronized with the input chopper. The output chopper is arranged in cascade in between the output of the amplifier and the output of the circuit. The input chopper and the output chopper can be operative as high frequency choppers.

In another more particular example embodiment of the present invention, feedback means comprises switching means for short-circuiting the input signal under control of a start-up signal; and means for adding back a sampled output signal to the amplifier for adapting the DC-offset of the amplifier. Also, the means for adding back the sampled output signal to the amplifier can include: an analog to digital converter with an input coupled to the output of the circuit, and with an output; a digital processing circuit with an input coupled to the output of the analog to digital converter, and an output; and a digital to analog converter with an input coupled to the output of the digital processing circuit, and an output coupled to the amplifier for adapting the DC-offset of the amplifier.

The above summary of the present invention is not intended to describe each illustrated embodiment or every implementation of the present invention. Other aspects include methods for using and for manufacturing such a thyristor and to memory arrangements employing the above-characterized thyristor construction. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
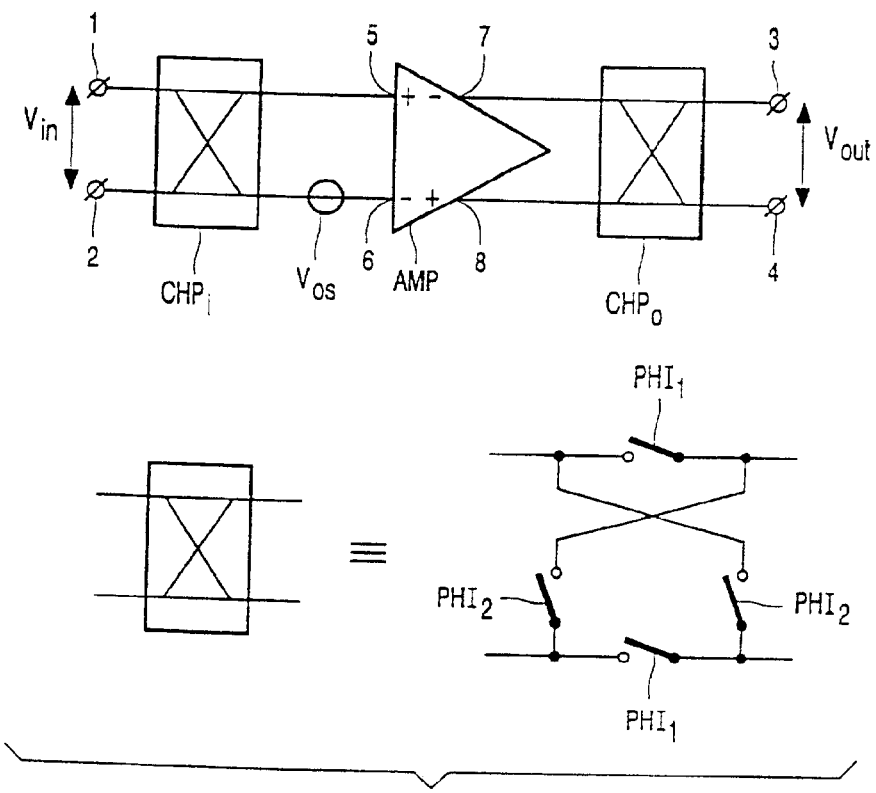
FIG. 1 is a circuit diagram of a known circuit for reducing DC-offset and noise in an amplifier circuit.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

Figure 2:
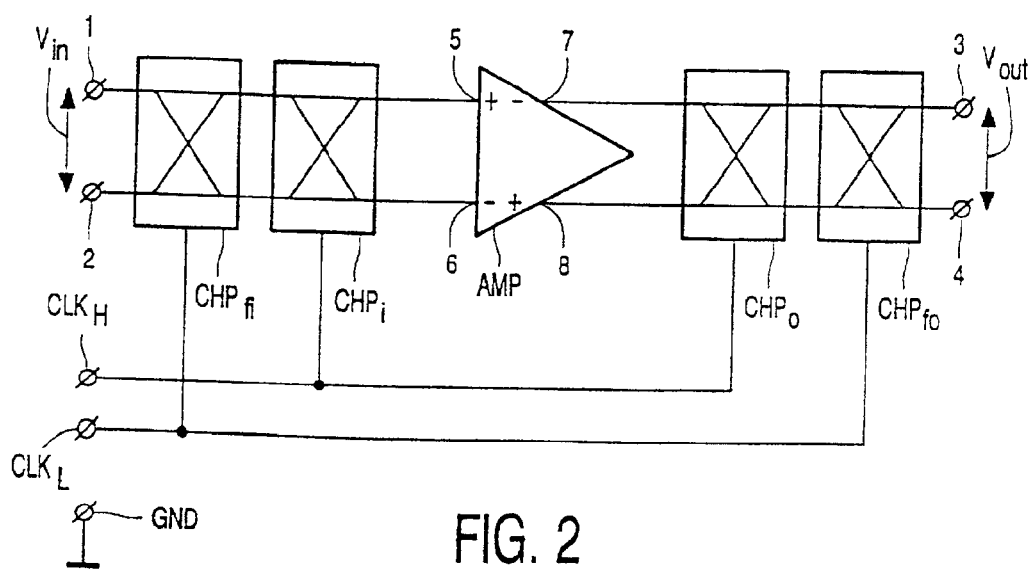
FIG. 2 is a circuit diagram of an example embodiment according to the present invention.

FIG. 2 shows a circuit diagram of a first embodiment of a circuit according to the invention. The circuit comprises an amplifier AMP having input nodes 5 and 6 for receiving an input signal $V_{in}$ which is available between input terminals 1 and 2 of the circuit, and output nodes 7 and 8 for delivering an output signal $V_{out}$ to output terminals 3 and 4 of the circuit. For the purpose of reducing the DC-offset and the noise produced by the amplifier AMP the circuit is further provided with an input chopper $CHP_i$, a further input chopper $CHP_{fi}$, an output chopper $CHP_o$, and a further output chopper $CHP_{fo}$. The input chopper $CHP_i$ and the further input chopper $CHP_{fi}$ are cascaded in between the input terminals 1 and 2 and the input nodes 5 and 6, whereby the further input chopper $CHP_{fi}$ is cascaded in between the input terminals 1 and 2 and the input chopper $CHP_i$. The output chopper $CHP_o$ and the further output chopper $CHP_{fo}$ are cascaded in between the output nodes 7 and 8 and the output terminals 3 and 4, whereby the further output chopper $CHP_{fo}$ is cascaded in between the output chopper $CHP_o$ and the output terminals 3 and 4.

The operation of the circuit is as follows. The input chopper $CHP_i$ and the output chopper $CHP_o$ receive a high frequency clock signal which is available between a first clock terminal $CLK_H$ and a reference terminal GND. By so doing the DC-offset and the noise produced by the amplifier AMP is significantly reduced. For obtaining an optimal noise reduction the frequency of the high frequency clock signal is as high as possible. In principle the DC-offset produced by the amplifier AMP would be virtually cancelled. However the so-called charge injections caused by the switches in the input chopper $CHP_i$ and the output chopper $CHP_o$ cause a DC-offset at the output of the output chopper $CHP_o$. To remove the DC-offset at the output of the output chopper $CHP_o$ the further input chopper $CHP_{fi}$ and the further output chopper $CHP_{fo}$ receive a low frequency clock signal which is available between a second clock terminal $CLK_L$ and the reference terminal GND. Because the further input chopper $CHP_{fi}$ and the further output chopper $CHP_{fo}$ operate at a relatively low frequency the further input chopper $CHP_{fi}$ and the further output chopper $CHP_{fo}$ do not introduce a DC-offset. The noise reduction of the further input chopper $CHP_{fi}$ and the further output chopper $CHP_{fo}$ is not optimal. This causes however no problem since the noise produced by the amplifier AMP is already cancelled by the input chopper $CHP_i$ and the output chopper $CHP_o$. Thus the combination of the input chopper $CHP_i$, the output chopper $CHP_o$, the further input chopper $CHP_{fi}$ and the further output chopper $CHP_{fo}$ guarantee an optimal DC-offset reduction and also an optimal noise reduction of the amplifier AMP. It is to be stated that though the frequency of the low frequency clock signal must be relatively low, it must not be chosen unnecessary low since the maximum transfer frequency of the circuit is in practice limited to half the value of the low frequency clock signal.

Figure 3:
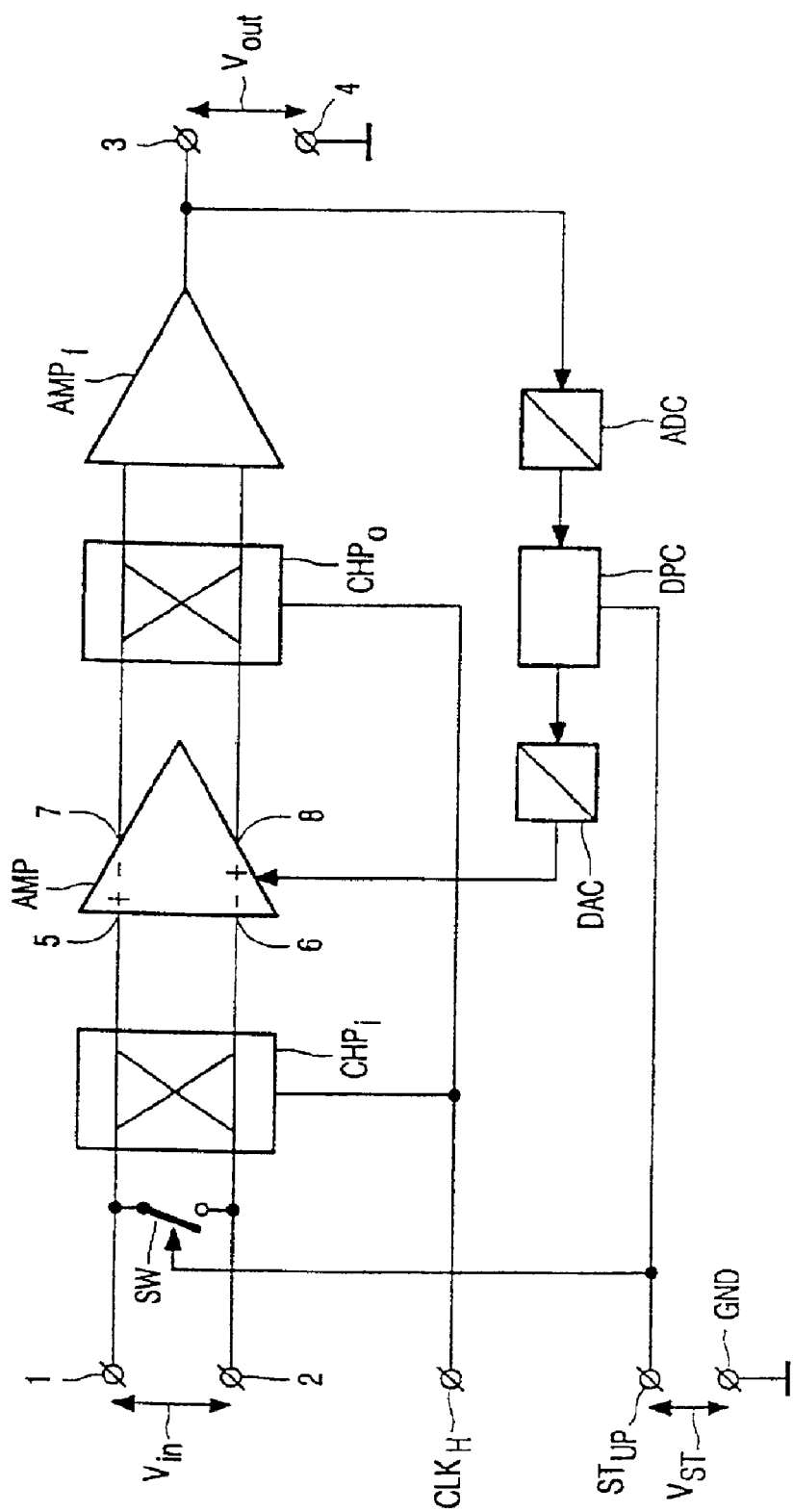
FIG. 3 is a circuit diagram of another example embodiment according to the present invention.

FIG. 3 shows a circuit diagram of a second embodiment of a circuit according to the invention. An important difference with respect to the first embodiment is that the circuit does not comprise the further input chopper $CHP_{fi}$ and the further output chopper $CHP_{fo}$. The cancellation of the DC-offset at the output of the output chopper $CHP_o$ is carried out in a different manner. This has the advantageous effect that the maximum transfer frequency of the circuit is much higher. The circuit is provided with a switch SW connected in between the input terminals 1 and 2. A control electrode of the switch SW is connected to a control terminal $ST_{UP}$. The circuit further comprises an analog to digital converter ADC with an input connected to the output terminal 3, and with an output; a digital processing circuit DPC with an input connected to the output of the analog to digital converter ADC, and an output; and a digital to analog converter DAC with an input connected to the output of the digital processing circuit DPC, and an output coupled to the amplifier AMP.

The operation of the circuit is as follows. At the start-up of the circuit the inputs of the input chopper $CHP_i$ is short-circuited under control of a start-up signal $V_{ST}$ which is available between the control terminal $ST_{UP}$ and the reference terminal GND. The DC-offset at the output of the output chopper $CHP_o$ is measured and fed back to the amplifier AMP in order to adapt the DC-offset of the amplifier AMP. This measurement is in fact accomplished by sampling the signal at the output of the output chopper $CHP_o$ during the start-up of the circuit. The sampling is accomplished in the digital domain in order to avoid the problem of leakage of a necessary sampling capacitor in the case that the sampling would be accomplished in the analog domain. For this reason the analog to digital converter ADC converts the analog output signal $V_{out}$ to a digital representation of the analog output signal $V_{out}$. The digital sampling is then performed by the digital processing circuit DPC. The digital output signal delivered by the digital processing circuit DPC is then converted to an analog signal by the digital to analog converter DAC for adapting the DC-offset of the amplifier AMP. The feedback loop created by the analog to digital converter ADC, the digital processing circuit DPC and the digital to analog converter DAC is active until the DC-offset at the output 3;4 of the circuit is virtually zero. Then the start-up signal $V_{ST}$ switches off the switch SW and the circuit is then ready for transferring the input signal $V_{in}$ to the output signal $V_{out}$. The adaption of the DC-offset of the amplifier AMP can for instance be accomplished by controlling a current of one transistor of a differential input pair within the amplifier AMP. By way of example the differential signal from the output chopper $CHP_o$ is transferred to a single-ended output signal $V_{out}$ by a further amplifier $AMP_f$.

If the circuit does not have to operate continuously the "start-up procedure" can be repeated now and then, for instance by doing a re-calibration after each sampling performed in the digital domain. This has the advantage that a potential DC-offset due to a temperature change after the completion of the start-up, is avoided.

Though varies signals are indicated as differential signals with regard to the first and the second embodiments the invention can also be carried out with single-ended signals. So for instance in FIG. 2 the input terminal 2 and/or the output terminal 4 could also be connected to the reference terminal GND. The inventive circuit can be implemented with discrete components as well as with an integrated circuit. All types of transistors can be used.

What is claimed is:

1. A circuit comprising: an amplifier producing a DC-offset and noise having an input for receiving an input signal from an input of the circuit, and an output for delivering an output signal to an output of the circuit; means for reducing the DC-offset and the noise produced by the amplifier and comprising an input chopper coupler to said input of said amplifier and an output chopper coupled to said output of said amplifier; and feedback means for further reducing the DC-offset produced by the amplifier.

2. A circuit comprising: an amplifier producing a DC-offset and noise having an input for receiving an input signal from an input of the circuit, and an output for delivering an output signal to an output of the circuit; means for reducing the DC-offset and the noise produced by the amplifier comprising an input chopper arranged in cascade in between the input of the circuit and the input of the amplifier, and an output chopper synchronized with the input chopper, which output chopper is arranged in cascade in between the output of the amplifier and the output of the circuit; and feedback means for further reducing the DC-offset produced by the amplifier.

3. A circuit as claimed in claim 2, wherein the input chopper and the output chopper are operative as high frequency choppers.

4. A circuit comprising: an amplifier producing a DC-offset and noise having an input for receiving an input signal from an input of the circuit, and an output for delivering an output signal to an output of the circuit; means for reducing the DC-offset and the noise produced by the amplifier; and feedback means for further reducing the DC-offset produced by the amplifier wherein the further feedback means for further reducing the DC-offset produced by the amplifier comprises switching means for short-circuiting the input signal under control of a start-up signal; and means for adding back a sampled output signal to the amplifier for adapting the DC-offset of the amplifier.

5. A circuit comprising: an amplifier producing a DC-offset and noise having an input for receiving an input signal from an input of the circuit, and an output for delivering an output signal to an output of the circuit; means for reducing the DC-offset and the noise produced by the amplifier; and feedback means for further reducing the DC-offset produced by the amplifier wherein the further feedback means for further reducing the DC-offset produced by the amplifier comprises switching means for short-circuiting the input signal under control of a start-up signal; and means for adding back a sampled output signal to the amplifier for adapting the DC-offset of the amplifier comprising an analog to digital converter with an input coupled to the output of the circuit, and with an output; a digital processing circuit with an input coupled to the output of the analog to digital converter, and an output; and a digital to analog converter with an input coupled to the output of the digital processing circuit, and an output coupled to the amplifier for adapting the DC-offset of the amplifier.

6. A circuit comprising: an amplifier producing a DC-offset and noise having an input for receiving an input signal from an input of the circuit, and an output for delivering an output signal to an output of the circuit; means for reducing the DC-offset and the noise produced by the amplifier; and feedback means for further reducing the DC-offset produced by the amplifier further including switching means, responsive to the feedback means, for short-circuiting the input signal under control of a start-up signal; and means for adding back a sampled output signal to the amplifier for adapting the DC-offset of the amplifier.

7. A circuit comprising: an amplifier producing a DC-offset and noise having an input for receiving an input signal from an input of the circuit, and an output for delivering an output signal to an output of the circuit; means for reducing the DC-offset and the noise produced by the amplifier; and feedback means for further reducing the DC-offset produced by the amplifier further including switching means, responsive to the feedback means, for short-circuiting the input signal under control of a start-up signal; and means for adding back a sampled output signal to the amplifier for adapting the DC-offset of the amplifier including an analog to digital converter with an input coupled to the output of the circuit, and with an output; a digital processing circuit with an input coupled to the output of the analog to digital converter, and an output; and a digital to analog converter with an input coupled to output of the digital processing circuit, and an output coupled to the amplifier for adapting the DC-offset of the amplifier.

8. A circuit comprising: an amplifier adapted to amplify an input signal and produce a DC-offset and noise and to deliver an output signal to an output of the circuit; a circuit adapted to respond to the amplifier by reducing the DC-offset and the noise produced by the amplifier including an input chopper arranged in cascade in between the input of the circuit and the amplifier, and an output chopper synchronized with the input chopper, which output chopper is arranged in cascade in between the amplifier and the output of the circuit; and a feedback circuit adapted to further reduce the DC-offset produced by the amplifier.

9. A circuit as claimed in claim 8 wherein the input chopper and the output chopper are operative as high frequency choppers.

10. A circuit comprising: an amplifier adapted to amplify an input signal and produce a DC-offset and noise and to deliver an output signal to an output of the circuit; a circuit adapted to respond to the amplifier by reducing the DC-offset and the noise produced by the amplifier; and a feedback circuit adapted to further reduce the DC-offset produced by the amplifier wherein the feedback circuit includes a switch circuit adapted to short-circuit the input signal under control of a start-up signal; and an adder circuit adapted to add back a sampled output signal to the amplifier and for adapting the DC-offset of the amplifier.

11. A circuit comprising: an amplifier adapted to amplify an input signal and produce a DC-offset and noise and to deliver an output signal to an output of the circuit; a circuit adapted to respond to the amplifier by reducing the DC-offset and the noise produced by the amplifier; and a feedback circuit adapted to further reduce the DC-offset produced by the amplifier wherein the feedback circuit includes a switch circuit adapted to short-circuit the input signal under control of a start-up signal; and an adder circuit adapted to add back a sampled output signal to the amplifier and for adapting the DC-offset of the amplifier including an analog to digital converter with an input coupled to the output of the circuit, and with an output; a digital processing circuit with an input coupled to the output of the analog to digital converter, and an output; and a digital to analog converter with an input coupled to the output of the digital processing circuit, and an output coupled to the amplifier for adapting the DC-offset of the amplifier.

12. A circuit as claimed in claim 11, wherein the feedback circuit includes a switch circuit adapted to short-circuit the input signal under control of a start-up signal; and an adder circuit adapted to add back a sampled output signal to the amplifier and for adapting the DC-offset of the amplifier.

13. The circuit of claim 1, wherein the feedback means is coupled between an input of the amplifier and an output of the means for reducing the DC-offset and the noise produced by the amplifier.

14. The circuit of claim 2, wherein the feedback means is coupled between an output of the output chopper and an input of the amplifier.

* * * * *